United States Patent
Zywitzki et al.

(10) Patent No.: US 6,554,971 B2
(45) Date of Patent: Apr. 29, 2003

(54) PVD COATED CUTTING TOOL AND METHOD OF ITS PRODUCTION

(75) Inventors: Olaf Zywitzki, Dresden (DE); Klaus Goedicke, Dresden (DE); Fred Fietzke, Dresden (DE); Siegfried Schiller, Dresden (DE); Torbjörn Selinder, Stockholm (SE); Mats Ahlgren, Täby (SE)

(73) Assignee: Sandvik AB, Sandviken (SE)

( * ) Notice: Subject to any disclaimer, the term of this patent is extended or adjusted under 35 U.S.C. 154(b) by 0 days.

(21) Appl. No.: 09/987,123

(22) Filed: Nov. 13, 2001

(65) Prior Publication Data

US 2002/0051852 A1 May 2, 2002

Related U.S. Application Data

(62) Division of application No. 09/561,984, filed on May 2, 2000, now abandoned.

(30) Foreign Application Priority Data

May 6, 1999 (SE) ............................................... 9901651

(51) Int. Cl.⁷ .............................................. C23C 14/34
(52) U.S. Cl. ........................... 204/192.16; 204/192.15; 204/192.12; 204/298.08; 204/192.22
(58) Field of Search ....................... 204/192.12, 192.15, 204/192.16, 192.22, 298.08

(56) References Cited

U.S. PATENT DOCUMENTS

| | | | |
|---|---|---|---|
| 4,284,687 A | 8/1981 | Dreyer et al. | 428/336 |
| RE32,111 E | 4/1986 | Lambert et al. | 428/212 |
| 4,966,676 A * | 10/1990 | Fukasawa et al. | 204/298.13 |
| 5,478,634 A | 12/1995 | Setoyama et al. | 428/216 |
| 5,487,625 A | 1/1996 | Ljungberg et al. | 407/119 |
| 5,503,912 A | 4/1996 | Setoyama et al. | 428/216 |
| 5,516,588 A | 5/1996 | van den Berg et al. | 428/469 |
| 5,587,233 A | 12/1996 | Konig et al. | 428/325 |
| 5,674,564 A | 10/1997 | Ljungberg et al. | 427/255.34 |
| 5,693,417 A | 12/1997 | Goedicke et al. | 428/336 |
| 5,698,314 A | 12/1997 | Goedicke et al. | 428/366 |
| 5,700,551 A | 12/1997 | Kukino et al. | 428/212 |
| 5,861,210 A | 1/1999 | Lenander et al. | 428/336 |
| 6,171,454 B1 * | 1/2001 | Weber et al. | 204/192.12 |
| 6,210,726 B1 | 4/2001 | Schiller et al. | 428/216 |
| 6,451,180 B1 * | 9/2002 | Schiller et al. | 204/192.15 |

FOREIGN PATENT DOCUMENTS

| | | |
|---|---|---|
| DE | 252 205 | 12/1987 |
| EP | 744 473 | 4/1996 |
| GB | 1 408 294 | 7/1972 |
| WO | WO 99/14390 * | 3/1999 |

OTHER PUBLICATIONS

Thornton & Chin, *Cer Bul* 56(1977)504.
Bunshah & Schramm, *Thin Solid Films* 40(1977)211.
F. Fietzke et al., "The deposition of hard crystalline $Al_2O_3$ layers by means of bipolar pulsed magnetron sputtering", *Surface & Coatings Technology*, 86–87, pp. 657–663, 1996.
O. Zywitzki et al., "Effect of the substrate temperature on the structure and properties of $Al_2O_3$ layers reactively deposited by pulsed magnetron sputtering", *Surface and Coatings Technology* 82 (1996) pp. 169–175.
O. Zywitzki et al., "Correlation between structure and properties of reactively deposited $Al_2O_3$ coatings by pulsed magnetron sputtering", *Surface & Coatings Technology*, 94–95, 1997 pp. 303–308.
F. Fietzke et al., "Pulsed Magnetron of Alumina Films: Crystalline Phases at Low Temperatures", No. 279 Jan–Feb–Mar. 1996, pp. 218–220.
O. Zywitzki et al., "Influence of coating parameters on the structure and properties of $Al_2O_3$ layers reactively deposited by means of pulsed magnetron sputtering", *Surface & Coatings Technology*, 86–87, pp. 640–647, 1996.

* cited by examiner

Primary Examiner—Rodney G. McDonald
(74) *Attorney, Agent, or Firm*—Burns, Doane, Swecker & Mathis, LLP

(57) ABSTRACT

The present invention describes a coating cutting tool for metal machining and a process for producing such tools. The coating is composed of one or more layers of refractory compounds of which at least one layer consists of nanocrystalline aluminum spinel of the type $(Me)_xAl_2O_{3+x}$ where Me is a second metal and $0 < x \leq 1$, deposited by Physical Vapor Deposition.

21 Claims, No Drawings

PVD COATED CUTTING TOOL AND METHOD OF ITS PRODUCTION

This application is a divisional of application Ser. No. No. 09/561,984, filed on May 2, 2000 now abandoned.

BACKGROUND OF THE INVENTION

The present invention relates to a cutting tools for metal machining comprising a body with, at least on the functional parts of the surface thereof, a hard and wear resistant refractory coating. The coating is adherently bonded to the body and covers all functional parts of the tool. The coating is composed of one or more layers of refractory compounds of which at least one layer is fine-crystalline aluminum spinel deposited by Physical Vapor Deposition (PVD) and the non spinel layer(s), if any at all, are metal nitrides and/or carbides with the metal elements chosen from Ti, Nb, Hf, V, Ta, Mo, Zr, Cr, W and Al.

It is well-known that for, e.g., cemented carbide cutting tools used in metal machining, the wear resistance of the tool edge can be increased considerably by applying thin, hard surface layers of metal oxides, carbides or nitrides with the metal either selected from the transition metals from the groups IV, V and VI of the Periodic Table or from silicon, boron and aluminum. The coating thickness usually varies between 1 and 15 um and the most widespread techniques for depositing such coatings are PVD and CVD (Chemical Vapor Deposition). It is also well-known that further improvements of the performance of a cutting tool can be achieved by applying a pure ceramic layer such as $Al_2O_3$ on top of layers of metal carbides and nitrides (U.S. Pat. Nos. 5,674,564 and 5,487,625).

Cemented carbide cutting tools coated with alumina layers have been commercially available for over two decades. The CVD technique usually employed involves the deposition of material from a reactive gas atmosphere on a substrate surface held at elevated temperatures. $Al_2O_3$ crystallizes into several different phase such as $\alpha$ (alpha), $\kappa$ (kappa) and $\chi$ (chi), called the "$\alpha$-series" with hcp (hexagonal close packing) stacking of the oxygen atoms, and into $\gamma$ (gamma), $\theta$ (theta), $\eta$ (eta) and $\delta$ (delta), called the "$\gamma$-series" with fcc (face centered cubic) stacking of the oxygen atoms. The most often occurring $Al_2O_3$-phases in CVD coatings deposited on cemented carbides at conventional CVD temperatures, 1000°–1050° C., are the stable alpha and the metastable kappa phases, however, occasionally the metastable theta phase has also been observed.

The CVD $Al_2O_3$-coatings of the $\alpha$-, $\kappa$- and/or $\theta$-phase are fully crystalline with a grain size in the range of 0.5–5 $\mu$m and having well-faceted grain structures.

The inherently high deposition temperature of about 1000° C. renders the total stress in CVD $Al_2O_3$-coatings on cemented carbide substrates to be tensile, hence the total stress is dominated by thermal stresses caused by the difference in thermal expansion coefficients between the substrate and the coating and less by intrinsic stresses which have their origin from the deposition process itself and are of compressive nature. The tensile stresses may exceed the rupture limit of $Al_2O_3$ and cause the coating to crack extensively and thus degrade the performance of the cutting edge in, e.g., wet machining where the corrosive chemicals in the coolant fluid may exploit the cracks in the coating as diffusion paths.

Other than $Al_2O_3$ other oxides, mixtures or combinations of oxides or compounds of the spinel type have been proposed as hard coatings deposited by CVD (GB 1,408, 294). They have not found a practical acceptance.

Generally CVD-coated tools perform very well when machining various steels and cast irons under dry or wet cutting conditions. However, there exists a number of cutting operations or machining conditions when PVD-coated tools are more suitable, e.g., in drilling, parting and threading and other operations where sharp cutting edges are required. Such cutting operations are often referred to as the "PVD coated tool application area".

Plasma assisted CVD, PACVD, makes it possible to deposit coatings at lower substrate temperatures as compared to thermal CVD temperatures and thus avoid the dominance of the thermal stresses. Thin $Al_2O_3$ PACVD films, free of cracks, have been deposited on cemented carbides at substrate temperatures of 450–700° C. (U.S. Pat. Nos. 5,516,588 and 5,587,233). The PACVD process for depositing $Al_2O_3$ includes the reaction between an Al-halogenide, e.g., $AlCl_3$, and oxygen donor, e.g., $CO_2$, and because of the incompleteness of this chemical reaction, chlorine is trapped in the $Al_2O_3$-coating and its content could be as large as 3.5%. Furthermore, these PACVD $Al_2O_3$-coatings are generally composed of, besides the crystalline alpha- and/or gamma-$Al_2O_3$-phase, a substantial amount of amorphous alumina which, in combination with the high content of halogen impurities, degrades both the chemical and mechanical properties of said coating, hence making the coating material non-optimized as a tool material.

The field of the present invention relates particularly to the art of PVD $Al_2O_3$ coated cutting tools or tools of similar hard materials such as cermets, ceramics and high speed steel or the superhard materials such as cubic boron nitride or diamond.

There exist several PVD techniques capable of producing refractory thin films on cutting tools and the most established methods are iron plating, DC- and RF-magnetron sputtering, arc discharge evaporation, IBAD (Ion Beam Assisted Deposition) and Activated Reactive Evaporation (ARE). Each method has its own merits and the intrinsic properties of the produced coatings such as microstructure/grainsize, hardness, state of stress, intrinsic cohesion to the underlying substrate may vary depending on the particular PVD method chosen. Early attempts to PVD deposit $Al_2O_3$ at typical PVD temperatures, 400–500° C., resulted in amorphous alumina layers which did not offer any notable improvement in wear resistance when applied on cutting tools. PVD deposition by HF diode- or magnetron sputtering resulted in crystalline $\alpha$-$Al_2O_3$ only when the substrate temperature was kept as high as 1000° C. (Thornton and Chin, Ceramic Bulletin, 56(1977)504). Likewise, applying the ARE method for depositing $Al_2O_3$, only resulted in fully dense and hard $Al_2O_3$-coatings at substrate temperatures around 1000° C. (Bunshah and Schramm, Thin Solid Films, 40(1977)211).

With the invention of the Pulsed Magnetron Sputtering especially in the mode of bipolar pulsed DMS technique (Dual Magnetron Sputtering) which is disclosed in DD 252 205 and U.S. Pat. No. 5,698,314, a wide range of opportunities opened up for the deposition of insulating layers such as $Al_2O_3$ and other oxides and, furthermore, the method has made it possible to deposit crystalline $Al_2O_3$-layers at substrate temperatures in the range of 500 to 800° C. In the bipolar dual magnetron system, the two magnetrons alternately act as an anode and a cathode and, hence, preserve a metallic anode over long process times. At high enough frequencies, possible electrical charging on the insulating layers will be suppressed and the otherwise troublesome phenomenon of "arcing" will be limited. Hence, according to U.S. Pat. No. 5,698,314, the DMS sputtering technique is capable of depositing and producing high-quality, well-adherent, crystalline $\alpha$-Al$_2$O$_3$ thin films at substrate temperatures less than 800° C. The "$\alpha$-Al$_2$O$_3$ layers" with a typical size of the $\alpha$-grains varying between 0.2 and 2 $\mu$m, may partially also contain the gamma ($\gamma$) phase from the "$\gamma$ series" of the Al$_2$O$_3$-polymorphs. The size of the $\gamma$-grains in the coating is much smaller than the size of the $\alpha$-grains. The $\gamma$-Al$_2$O$_3$ grain size typically varies between 0.05 and 0.1 $\mu$m. In the Al$_2$O$_3$-layers where both modifications of $\gamma$ and $\alpha$-phase were found, the $\gamma$-Al$_2$O$_3$-phase showed a preferred growth orientation with a (440)-texture. When compared to prior art plasma assisted deposition techniques such as PACVD as described in U.S. Pat. No. 5,587,233, the novel, pulsed DMS sputtering deposition method has the decisive, important advantage that no impurities such as halogen atoms, e.g., chlorine, are incorporated in the Al$_2$O$_3$-coating. A disadvantage of films containing the $\alpha$-phase is the relatively rough surface topography. The main disadvantage of polytype other than $\alpha$-Al$_2$O$_3$ containing films is that the chemical instability is likely to be less. At very high cutting temperatures phase transformation into the $\alpha$-phase occurs. These phase transformations are connected with a volume contraction which causes cracks and delamination of the films.

OBJECTS AND SUMMARY OF THE INVENTION

It is an object of this invention to avoid or alleviate the problems of the prior art.

It is further an object of this invention to provide a cutting tool for metal machining comprising a body with, at least on the functional parts of the surface thereof, a hard and wear resistant refractory coating.

In one aspect of the invention there is provided a cutting tool comprising a body- with, at least on the functional parts of the surface thereof, a 0.5 to 20 $\mu$m thick hard and wear resistant coating wherein said coating includes at least on 0.5 to 10 $\mu$m thick layer showing a nanocrystalline microstructure and consisting of an aluminum spinel compound of the type (Me)$_x$Al$_2$O$_{3+x}$ (0<x$\leq$1), where Me is formed of one or more of the metals of the group Mg, Zn, Mn, Fe, Co, Ni, Cd and Cu, Cr and Sn.

In another aspect of the invention there is provided a method of making a cutting tool comprising a body with at least on the functional parts of the surface thereof, a 0.5 to 20 $\mu$m thick hard and wear-resistant coating, said process comprising depositing at least one refractory layer consisting of a nanocyrstalline Al-spinel compound of the type (Me)$_x$Al$_2$O$_{3+x}$ (0<x$\leq$1), where Me is selected from the group consisting of Mg, Zn, Mn, Fe, Co, Ni, Cd, Cu, Cr and Sn and mixtures thereof, by reactive pulsed magnetron sputtering in a mixture of a rare and a reactive gas under the following conditions:

the pulse frequency is set for 10 to 100 kHz, the deposition occurs with a rate of at least 1 nm/s with reference to a stationarily arranged substrate, the flux of the impinging particles onto each individual substrate is cyclically interrupted, the magnetron power density in time average is set for at least 10 W/cm$^2$, the flow of the reactive gas is set for such a value that the impedance of the magnetron discharge lies between 150% and 250% of the impedance of a discharge burning between totally oxide-covered target electrodes, and the substrate temperature is set in the range 400° C. to 700° C. depending on the material of the tool body being coated.

DETAILED DESCRIPTION OF THE PREFERRED EMBODIMENTS OF THE INVENTION

According to the present invention, there is provided a cutting tool for metal machining such as turning (threading and parting), milling and drilling, comprising a body of a hard alloy such as cemented carbide, cermet, ceramics or high speed steel or the superhard materials such as cubic boron nitride or diamond onto which a hard and wear resistant refractory coating is deposited by Pulsed Magnetron Sputtering at substrate temperatures of 400° C. to 700° C., preferably 500° C. to 600° C., depending on the particular material of the tool body. The wear resistant coating is composed of one or more layers of refractory compounds of which at least one layer, preferably the outermost layer, is a nanocrystalline aluminum spinel compound of the type (Me)$_x$Al$_2$O$_{3+x}$ (0<x$\leq$1), preferably (0.01<x<1), most preferably (0.05<x$\leq$1), where Me is formed of one or more of the metals of the group Mg, Zn, Mn, Fe, Co, Ni, Cd, Cu, Cr and Sn and the innermost layer(s), if any at all, between the tool body and the aluminum spinel compound layer, is composed of metal nitrides and/or carbides with the metal elements selected from Ti, Nb, Hf, V, Ta, Mo, Zr, Cr, W and Al. In contrast to the state of the art, the aluminum spinel compound layers consist of high-quality, dense, fine-grained crystalline aluminum spinel compound with a grainsize less than 0.2 $\mu$m. Preferably, the spinel is in the form of crystallites having a lateral extension of 10 to 200 nm. Furthermore, the aluminum spinel compound layers are virtually free of cracks and halogen impurities.

The aluminum spinel compound layers according to the invention further give the cutting edges of the tool an extremely smooth surface finish which, compared to prior art $\alpha$-Al$_2$O$_3$ coated tools, results in an improved surface finish also of the workpiece being machined. The very smooth surface finish can be attributed to the very fine crystallinity of the coating. Identification of the aluminum spinel compound layers according to the invention can preferably be made by X-ray diffraction in combination with energy dispersive spectrometry (EDS). Strong reflexes of at least one of the (400) and (440) lattice planes can be identified. Weaker reflexes from the (111), (220), (311), (222) and (511) lattice planes of the aluminum spinel compound can occasionally be identified. Reflexes of the pure MeO phases do not occur.

A second identification method for the aluminum spinel compound phases is based on electron diffraction in a Transmission Electron Microscope (TEM) again in combination with EDS, or a chemical analysis method. The diffraction patterns show rings from polycrystalline aluminum spinel.

The nanocrystalline aluminum spinel compound according to the invention is strongly textured in the [440]-direction. A Texture Coefficient, TC, can be defined as:

$$TC(hkl) = \frac{I(hkl)}{I_0(hkl)} \left\{ \frac{1}{n} \sum \frac{I(hkl)}{I_0(hkl)} \right\}^{-1}$$

where

I(hkl)=measured intensity of the (hkl) reflection

I$_0$(hkl)=standard of intensity from the ASTM standard powder pattern diffraction data n=number of reflections used in the calculation (hkl) reflections used are: (111), (311), (222), (400) and (440) and whenever the TC(hkl) >1, there is a texture in the [hkl]-direction. The larger of the value of TC(hkl), the more pronounced is the texture. According to the presently claimed invention, the TC for the set of (440) crystal planes is greater than 1.5.

When the nanocrystalline aluminum spinel compound coated cemented carbide cutting tools according to the invention are used in the machining of steel or cast iron, several important improvements compared to prior art have been observed which will be demonstrated in the forthcoming examples. Surprisingly, the PVD aluminum spinel compound without containing any portion of the coarser and thermodynamically stable $\alpha$-$Al_2O_3$ phase, shows in certain metal machining operations, a wear resistance which is equal to the wear resistance found in coarser CVD $\alpha$-$Al_2O_3$ coatings deposited at temperatures around 1000° C. It is believed that the reason for this behavior is the high chemical stability of the spinel compound also at high temperatures up to 1000° C. in combination with a relatively high hardness of at least 16 GPa caused by the special nanocrystalline microstructure. Furthermore, the fine-grained PVD aluminum spinel compound coatings show a wear resistance considerably better than prior art PVD coatings. These observations open up the possibility to considerably improve the cutting performance and prolong the tool lives of coated PVD tools. The low deposition temperature will also make it possible to deposit PVD aluminum spinel compound coatings on high speed steel tools and the superhard materials cubic boron nitride and diamond.

A further improvement in cutting performance can be anticipated if the edges of the aluminum spinel compound coated cutting tools according to the invention are treated by a gentle wet-blasting process or by edge brushing with brushes based on, e.g., SiC, as disclosed in U.S. Pat. No. 5,861,210. Another advantage for using spinel compounds according to the invention is the possibility of deposition of colored layers either because of the intrinsic property of the spinel or by incorporating a small amount of other cations like Fe, Cu, Co or Cr. The color is of great practical importance for the visual evaluation of the wear state of a coated cutting tool.

The total coating thickness according to the present invention varies between 0.5 and 20 $\mu$m, preferably between 1 and 15 $\mu$m, with the thickness of the non-aluminum spinel compound layer(s) varying between 0.1 and 10 $\mu$m, preferably between 0.5 and 5 $\mu$m. The fine-grained aluminum spinel compound coating can also be deposited directly onto the cutting tool substrate of cemented carbide, cermet, ceramics or high speed steel or superhard materials and the thickness of said aluminum spinel compound varies then between 0.5 and 15 $\mu$m, preferably between 1 and 10 $\mu$m. Similarly, further coatings of metal nitrides and/or carbides with the metal elements selected from Ti, Nb, Hf, V, Ta, Mo, Zr, Cr, W and Al can be deposited on top of the aluminum spinel compound layer, particularly an outer layer of TiN, Ti(C,N), TiN or (Ti,Al)N.

In a preferred embodiment of the invention, a first coating of at least one layer, said first coating having a total thickness of 0.1 to 10 $\mu$m, preferably 0.5 to 5 $\mu$m, comprising metal nitrides or carbides or carbonitrides with the metal elements selected from the group Ti, Nb, Hf, V, Ta, Mo, Zr, Cr, W and Al is deposited. Preferably, said first coating is TiC, Ti(C,N), TiN or (Ti,Al)N.

In yet another preferred embodiment in the tool according to the invention, the first coating and/or outer layer comprises a multilayer portion with a periodic or aperiodic sequence of at least two different layers chosen from TiC, TiCN, TiN or TiAl N.

The aluminum spinel compound layer according to the presently claimed invention is deposited by pulsed magnetron sputtering at a substrate temperature of 400–700° C., preferably 500–600° C., using elementary or alloyed targets of the metals and a mixture of at least one rare and at least one reactive gas, preferably argon and oxygen. A preferred solution to carry out the pulsed magnetron sputtering process is the usage of a Dual Magnetron System (DMS). Additionally, the process according to the presently claimed invention is characterized in cyclic interruptions of the flux of particles impinging onto each individual substrate. This flux consists of neutrals, ions, electrons, -photons, etc. It seems that these interruptions cause renucleation processes resulting in the observed very fine grained structure of the spinel layer. One easy way to realize said cyclic interruptions of the flux is to fixture the substrate on a cylindrical basket which rotates in front of the magnetrons, hence causing the substrates moving in and out of the plasma deposition zone. Alternatively, the cyclic interruptions can also be attained by shadowing the targets or substrates or by interrupting the power supply of the sputtering devices. A further characteristic of the process is setting the flow of the reactive gas for such a value that the impedance of the magnetron discharge lies between 150% and 250% of the impedance of a discharge burning between totally oxide-covered target electrodes. This totally oxide-covered state of the targets is indicated by a drastically reduced deposition rate and the presence of oxygen lines in the optical emission spectrum of the plasma. Further, improvement of the microstructure and phase composition of the spinel layer will be achieved by applying a bipolar pulsed bias voltage to the substrates during the deposition. This leads to an alternating flux of ions and electrons necessary for the cyclic discharge of the growing insulating layer. Preferred is a bias voltage level between 20 and 200 V, preferably between 50 and 100 V, at a frequency in the range of 1–5 kHz. Depending on the geometric conditions of the deposition arrangement, an asymmetric bias pulsing with regard to the parameters voltage level and pulse duration can be useful. In this case, the duration of the positive polarity should be significantly lower than or at most equal to the duration of the negative polarity.

The layer(s) described in the presently claimed invention, comprising metal nitrides and/or carbides and/or carbonitrides and with the metal elements selected from Ti, Nb, Hf, V, Ta, Mo, Zr, Cr, W and Al can be deposited by PVD-technique, CVD- and/or MTCVD-technique (Medium Temperature Chemical Vapor Deposition).

The superiority of the fine-grained aluminum spinel compound PVD layers according to the present invention, compared to prior art PVD coatings is demonstrated in Example 1. Example 2 demonstrates the surprisingly good wear resistance properties of the fine-grained aluminum spinel compound layers compared to traditionally CVD-layers composed of $\kappa$-$Al_2O_3$ and $\alpha$-$Al_2O_3$.

The invention is additionally illustrated in connection with the following Examples which are to be considered as illustrative of the present invention. It should be understood, however, that the invention is not limited to the specific details of the Examples.

EXAMPLE 1

A) Commercially available cemented carbide threading inserts of style LCMX 040308-53 with a coating thickness of approximately 3 μm having a cemented carbide composition of 10 wt % Co and balance WC.

B) TiN coated tools from A) were coated with a 2 μm fine-grained aluminum magnesium spinel ($MgAl_2O_4$) layer in a separate experiment with the pulsed magnetron sputtering technique using a DMS system with one magnesium target and one aluminum target operating at 50 kHz in an oxygen argon mixture. The power density in time average was set for 24 W/cm² on the aluminum target and 14 W/cm² on the magnesium target, respectively. All inserts were fixed on a rotating drum during deposition, the angle of incidence was limited by shields in the surrounding of DMS to ±30°. The deposition temperature was 600° C. A symmetrical bipolar pulsed bias voltage of 80 V at a frequency of 3 kHz was applied to the substrates. The reactive working point of the discharge was stabilized at an impedance of 200% of that impedance measured for totally oxide-covered target electrodes.

The aluminum magnesium spinel coating from B) appeared milky white and had a very smooth surface. SEM studies of a cross-section showed a glassy-like fracture without porosity. The TEM investigation leads to a grain size between 50 nm and 100 nm. EDS measurements showed the presence of a nearly stoichiometric compound according to the formula $MgAl_2O_4$ with an argon content below 0.3 wt %. The XRD investigation clearly identified the cubic spinel structure with the reflexes (220), (311), (400) and (440). The calculated Texture Coefficient for the (440) reflexes amounted to 2.5.

Coated tool inserts from A) and B) were then tested in a drilling operation in a workpiece material of the low alloyed, non-hardened steel SS2541.

Both flank and crater wear were developed on the cutting edges. The extent of the flank wear determined the life time of the cutting tool. The results of the cutting tests showed that the inserts were able to drill more holes and showed a smaller extent of the flank wear in comparison to A).

EXAMPLE 2

C) Cemented carbide inserts of style CNMA 120412-KR having a composition of 6 wt % Co and balance WC, coated with a first layer of 8 μm TiCN and thereafter with a top layer of 4 μm κ- and α-$Al_2O_3$. Both layers were deposited by conventional CVD technique. The grain size of the 1κ- and α-phase lies between 0.5 and 1.2 μm.

D) Cemented carbide inserts of the same style and composition as in C) were first coated with an approximately 3 μm thick TiCN layer and thereafter with a 2.5 μm thick fine-grained magnesium aluminum spinel with a partial substitution of 3 wt % Mg by Fe. Both layers were deposited by a DMS sputter process without vacuum interruption. To obtain a partial substitution of Mg by Fe, a mosaic magnesium target with iron plugs was used. The substrate temperature was 550° C. All other parameters corresponded to those reviewed for B).

The coating from D) appeared blue and showed a very smooth surface. SEM investigations showed no porosity. The grain size was evaluated by TEM investigations to less than 50 nm.

The EDS measurement gave the following composition:

| | |
|---|---|
| aluminum | 27 at % |
| magnesium | 13 at % |
| iron | ≈0.5 at % |
| argon | 0.2 at % |
| oxygen | balance |

The electron diffraction pattern shows the rings of the nanocrystalline cubic spinel structure. The hardness of the nanocrystalline aluminum magnesium spinel amounts 20 GPa and the intrinsic stress is 3 GPa compressive.

Coated inserts from C) and D) were then tested in a continuous turning operation in a ball bearing steel (Ovako 825). The crater wear of the cutting edges was measured in an optical microscope. The machining time until the top layer was worn through, was registered (i.e, when the inner TiCN just becoming visible).

At a cutting speed of 200 m/min, a feed of 0.25 mm/rev and a depth of cut of 2 mm using coolant, the machining time of inserts deposited according to the invention was higher by a factor of 1.5 compared to the prior art coated inserts. The improvement can be explained by the higher chemical stability of the magnesium aluminum spinel layer in comparison to the CVD alumina layer. In addition, the blue color of the spinel coating allows to detect the end of the service life of the inserts with good accuracy in a simple way.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of making a cutting tool comprising a body with at least on the functional parts of the surface thereof, a 0.5 to 20 μm thick hard and wear resistant coating, said process comprising depositing at least one refractory layer consisting of a nanocyrstalline Al-spinel compound of the type $(Me)_xAl_2O_{3+x}$ ($0<x\leq1$), where Me is selected from the group consisting of Mg, Zn, Mn, Fe, Co, Ni, Cd, Cu, Cr and Sn and mixtures thereof, by reactive pulsed magnetron sputtering in a mixture of a rare and a reactive gas under the following conditions:

the pulse frequency is set for 10 to 100 kHz, the deposition occurs with a rate of at least 1 nm/s with reference to a stationarily arranged substrate, the flux of the impinging particles onto each individual substrate is cyclically interrupted, the magnetron power density in time average is set for at least 10 W/cm², the flow of the reactive gas is set for such a value that the impedance of the magnetron discharge lies between 150% and 250% of the impedance of a discharge burning between totally oxide-covered target electrodes, and the substrate temperature is set in the range 400° C. to 700° C. depending on the material of the tool body being coated.

2. The method of claim 1 wherein the pulse frequency is set for 20 to 50 kHz.

3. The method of claim 1 wherein the substrate temperature is set in the range of 500° C. to 600° C.

4. The process of claim 1 wherein the $(Me)_xAl_2O_{3+x}$ layer is deposited by reactive sputtering of alloyed or mosaic targets with the total composition $(Me)_xAl_2$.

5. The process of claim 1 wherein the $(Me)_xAl_2O_{3+x}$ layer is deposited by reactive sputtering using Dual Magnetron System with one aluminum target and one target made from the other metal or from an alloy of this metal and aluminum.

6. The process of claim 1 wherein the rare gas is argon.

7. The process of claim 1 wherein the reactive gas is oxygen.

8. The process of claim 1 wherein the cyclic interruption of the flux of impinging particles occurs periodically with a frequency in the range between 0.1 per minute and 10 per minute.

9. The process of claim 1 wherein the duration of the interruption of the flux of the impinging particles is at least 10% of the duration of the whole period.

10. The process of claim 1 wherein the cyclic interruption of the flux of impinging particles occurs aperiodically.

11. The process of claim 1 wherein a bipolar pulsed bias voltage is applied to the substrates.

12. The process of claim 11 wherein the applied bipolar bias voltage is asymmetric for both polarities with regard to at least one of the parameters voltage level and pulse duration.

13. The process of claim 11 wherein the maximum value of the bias voltage in each pulse lies in the range of 20 to 200 V.

14. The process of claim 13 wherein the maximum value of the bias voltage is in the range of 50 and 100 V.

15. The process of claim 11 wherein the-pulse-bias frequency lies in the range of 100 Hz to 10 kHz and the duration of the positive polarity of the substrate is at most equal to the duration of the negative polarity.

16. The process of claim 15 wherein the pulse bias frequency lies in the range of 1 kHz to 5 kHz.

17. The process of claim 15 wherein the duration of the positive polarity of the substrate is 5 to 20 times lower than the duration of the negative polarity.

18. The process of claim 11 wherein the additional, non-spinel-layers are also deposited by physical vapor deposition process.

19. The process of claim 18 wherein the additional, non-spinel-layers are deposited by pulsed magnetron sputtering.

20. The process of claim 18 wherein all layers are deposited in the same process without vacuum interruption.

21. The process of claim 18 wherein additional inner layers are applied by a chemical vapor deposition process.

* * * * *